United States Patent [19]

Leininger

[11] Patent Number: 4,513,283
[45] Date of Patent: Apr. 23, 1985

[54] LATCH CIRCUITS WITH DIFFERENTIAL CASCODE CURRENT SWITCH LOGIC

[75] Inventor: Joel C. Leininger, Boca Raton, Fla.

[73] Assignee: International Business Machines Corporation, Armonk, N.Y.

[21] Appl. No.: 445,599

[22] Filed: Nov. 30, 1982

[51] Int. Cl.³ .................. H04Q 1/20; H03K 19/00; H03K 3/289
[52] U.S. Cl. .................. 340/825.02; 307/467; 307/455
[58] Field of Search .................. 340/825.02, 825.03; 307/455, 456, 467, 244, 573; 371/24, 61, 63, 70

[56] References Cited

U.S. PATENT DOCUMENTS 4,237,387  12/1980  Devendorf et al. ............... 307/455
4,276,488  6/1981  Benedict et al. ................... 307/455

Primary Examiner—Donald J. Yusko
Attorney, Agent, or Firm—D. Kendall Cooper

[57] ABSTRACT

Latch circuits implemented in multiple level Cascode Current Switch logic for performing various complex latch functions including Level Sensitive Scan Design (LSSD) testing and implementable in VLSI technology are described.

21 Claims, 9 Drawing Figures

SET/RESET FUNCTION

UNIT DELAY

BI STABLE LATCH

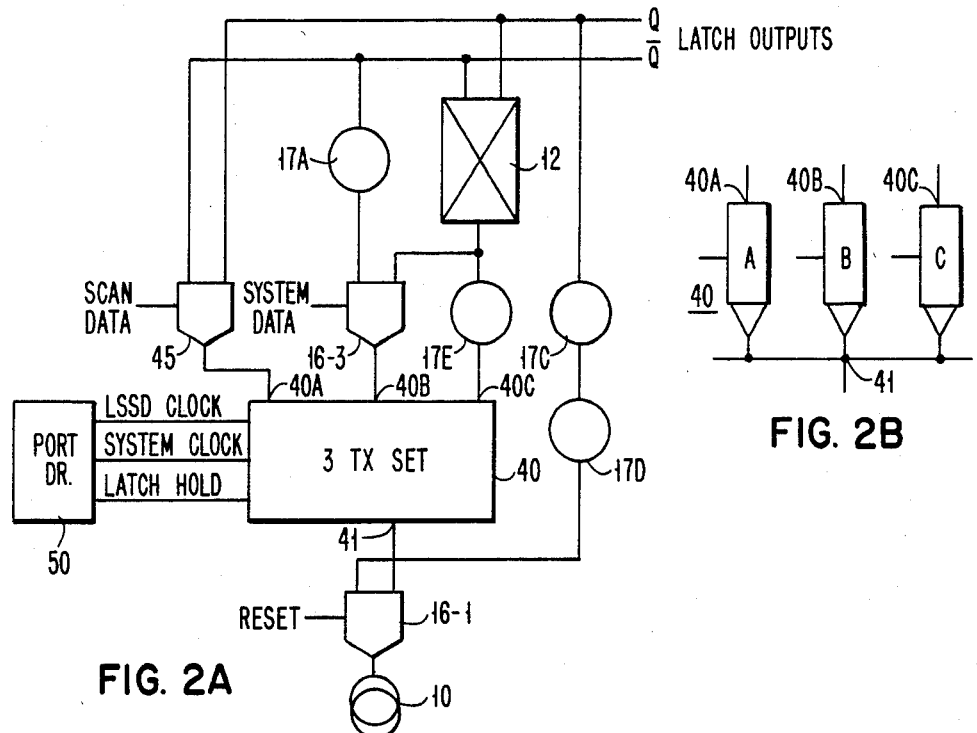
FIG. 2A
FIG. 2B
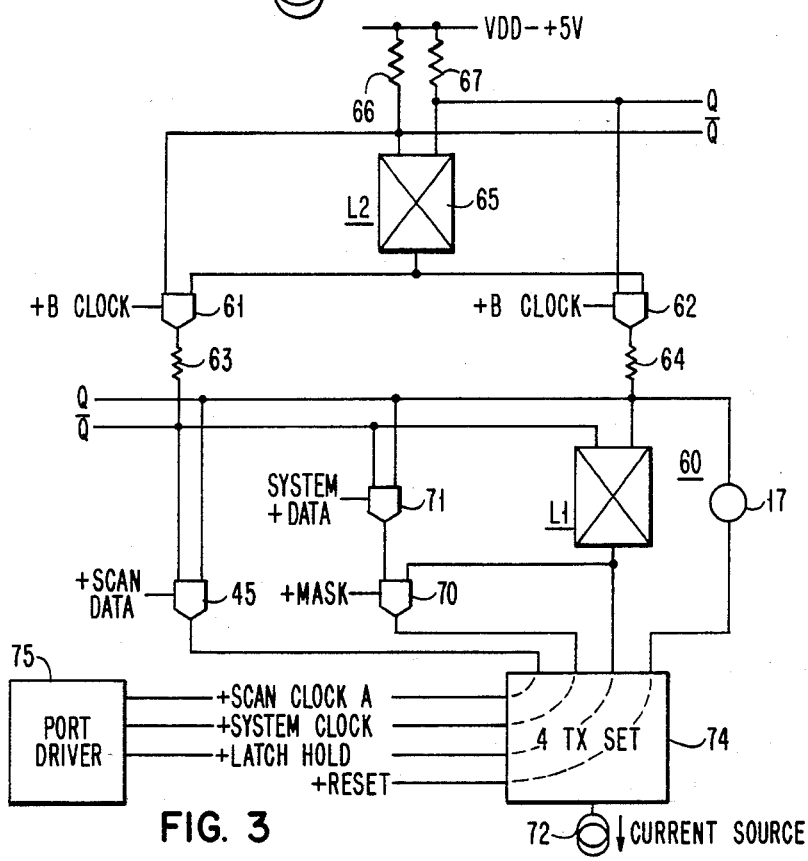
FIG. 3

LATCH CIRCUITS WITH DIFFERENTIAL CASCODE CURRENT SWITCH LOGIC

DESCRIPTION

Background of the Invention

1. Field of Invention

This invention relates in general to multi-level Cascode Current Switch logic and, in particular, to VLSI implementations of such logic.

2. Description of the Prior Art

Very Large Scale Integration (VLSI) technology has increased the number of transistor devices that may be placed on semiconductor chips. As the number of devices increases and, hence, the number of possible circuits increases, two areas of concern have developed. The amount of power that is consumed by the VLSI chip becomes a problem in that power consumed is converted to heat which must be dissipated and controlled if the chip is to operate satisfactorily. It is known in the art that power can be reduced by employing a multi-level cascode current switch (CCS) technology such as disclosed in U.S. Pat. No. 3,446,989. In CCS logic, a basic logic tree involves a number of levels each comprising basic cells. In one known arrangement, referred to as Cascode Emitter Coupled Logic (CECL), a basic cell comprises a pair of bipolar type transistors which have their emitters coupled together to define an input terminal. The cell at the first level has its input terminal connected to a current source for the tree. Cells in other levels have their inputs connected to one of a pair of output terminals of a cell in the preceding stage. The cell also includes two control input terminals comprising the bases of the respective transistors in the cell. If the control input terminals are supplied with the true and complement form of the logic input signal, the system is referred to as a Differential CCS (DCCS) or double-rail type system. In some implementations, one control input is supplied with a reference signal, while the other input terminal receives the true form of the logic signal. The two output terminals of the cell are connected to different cells in the next higher level of the tree.

The number of levels selected for the tree can vary from two up to six, seven or eight, depending on the complexity of the logic desired to be accomplished. The outputs of the tree are connected to a voltage source through load resistors, one resistor being associated with each output terminal of each cell in the last level. Only one current path may be established between the current source and the load resistor since, at each level, the current from the preceding level is supplied or steered to only one cell at that level and, in turn, that cell steers current to only one cell at the next level. Logically, "N" cascoded cells serially connected represent an "N" input AND-gate or a more complex function such as an "N" input parity check circuit. The logical arrangement is similar in many respects to relay logic employed in early data processing machines, except that the voltage levels of input signals to the cell are dependent on the level at which that cell is positioned in the logic tree. Therefore, different signals at the same logic level must have the same voltage levels.

The other concern which arises as the number of circuits increase on a chip is the problem of testing the devices per se or the circuits formed from the devices after the chip has been personalized. A system is presently employed in the art which operates to test each circuit on the chip. A description of this testing technique, referred to as Level Sensitive Scan Design testing (LSSD), may be found in U.S. Pat. Nos. 3,783,254, 3,806,891 and IBM Technical Disclosure Bulletin, Vol. 22, No. 8B, January 1980, page 3660. The essence of such a system is to provide a linked pair of latches L1 and L2 which form a Shift Register Latch (SRL) pair or stage. In order to implement an LSSD testing approach for cascode current logic, it has been the practice to provide a current source associated with the L1 latch and a second current source for the L2 latch of the Shift Register Latch pair. A typical prior art implementation for LSSD testing is shown in FIG. 1 of pending U.S. application Ser. No. 06/445,601, filed concurrently herewith and assigned to the assignee of the present invention, while FIG. 2 of that application illustrates an improvement over the arrangement shown in FIG. 1 in that the second current source is eliminated and the L2 latch is effectively merged with the L1 latch and, hence, employs the same current source.

The bistable devices illustrated in that application are referred to in the art as polarity hold latches and basically function to capture the data, for example, a "1" or a "0" at each clock interval. There are, however, certain circumstances where the function of a polarity hold latch is not appropriate and a device which is switched from a "0" state to a "1" state in response to a clock pulse and a "1" data pulse remains in the "1" state until reset, even though other clock pulse signals are applied to the device. This function is often employed to store error conditions or interrupt signals. Such a device must also have the ability to be reset or switched back to the "0" state so that the contents can be cleared at the appropriate time. A bistable device having these characteristics is generally referred to in the art as a set/reset latch. If the set/reset latch is to be employed as the L1 latch of the L1/L2 Shift Register Latch pair for LSSD testing, provisions must be made to enter both system data and scan data selectively into the latch.

When the logic of the latch has been implemented in Cascode Current Switch logic, the logic for implementing the additional LSSD logic terms must cooperate with the existing current switch logic. Such cooperation requires that the additional logic levels required to implement the added LSSD functions do not increase the number of logic levels beyond that employed on the chip. Generally, the addition of an input term to a logical AND function implemented in current switch technology adds one logic level to the logic since the current switches at different levels are serially connected to perform the logical AND function. Where the number of logic levels selected is relatively low, a problem has existed in the prior art when adding additional logic functions. One feature of the present invention is directed to adding additional functions, such as LSSD functions, to either an L1 or L2 type latch in current switch logic without complicating any other considerations involved in selecting a given number of levels for the chip.

A similar problem exists in the prior art in attempting to implement a latch function in current switch technology in which the "B clock" of the LSSD test technique controls the state of the L2 latch independently of the state of the L1 latch. That is, a function to permit scan data to be inserted into the L2 latch directly and latched there.

The set/reset mask function for an L1 latch also has created a problem for current switch logic implementation. That function is useful in handling interrupts where one logic input term to the latch is an interrupt request signal and the interrupt request inputs are clocked by the system clock. A mask logic term, e.g. a "1" or a "0", is employed to selectively enable or enter the interrupt request in the latch. The L1 latch must function as a set/reset latch so a reset logic term is also employed to reset the L1 latch after the selected interrupt request has been serviced. The required logic for the reset function must return the latch to the "0" state.

An L1/L2 merged latch pair in which the set/reset mask function is implemented in multi-level cascode current switch technology for the L1 latch is difficult to implement in accordance with prior art teachings.

Similar latch functions have been difficult to implement with prior art teachings when attempts have been made to meet the logic term requirements of LSSD testing techniques and the logic term requirements of complex latch functions.

SUMMARY OF THE INVENTION

A set/reset latch arrangement is provided in Differential Cascode Current logic in which the latch is set from a "0" state to a "1" state by a system clock sampling the data (1 bit) and only resets to its initial "0" state by a specific reset pulse. By the addition of an LSSD port at one level in the current switch tree, the latch is operable as an L1 latch of an L1/L2 Shift Register Latch pair for LSSD testing techniques. Further modifications provide merged L1/L2 Shift Register Latch pairs which share one current source, accommodate LSSD testing techniques and implement other complex latch functions.

It is, therefore, an object of the present invention to provide an arrangement which implements complex latch functions in Cascode Current Switch technology on VLSI chips where LSSD test criteria is also included with the logic.

The foregoing and other objects, features and advantages of the invention will be apparent from the following more particular description of a preferred embodiment of the invention as illustrated in the accompanying drawing.

BRIEF DESCRIPTION OF THE DRAWING

FIG. 2a is a differential cascode current switch latch similar to that shown in FIG. 1 in which the LSSD port has been added;

FIG. 2b is a schematic representation of the LSSD port shown in FIG. 2a;

FIG. 3 illustrates a merged L1/L2 Shift Register Latch pair provided with an LSSD port in which the L1 latch performs a set/reset mask function and in which scan data is entered into the L2 latch directly and is maintained in the latch;

DESCRIPTION OF THE PREFERRED EMBODIMENT

Figure 1A:
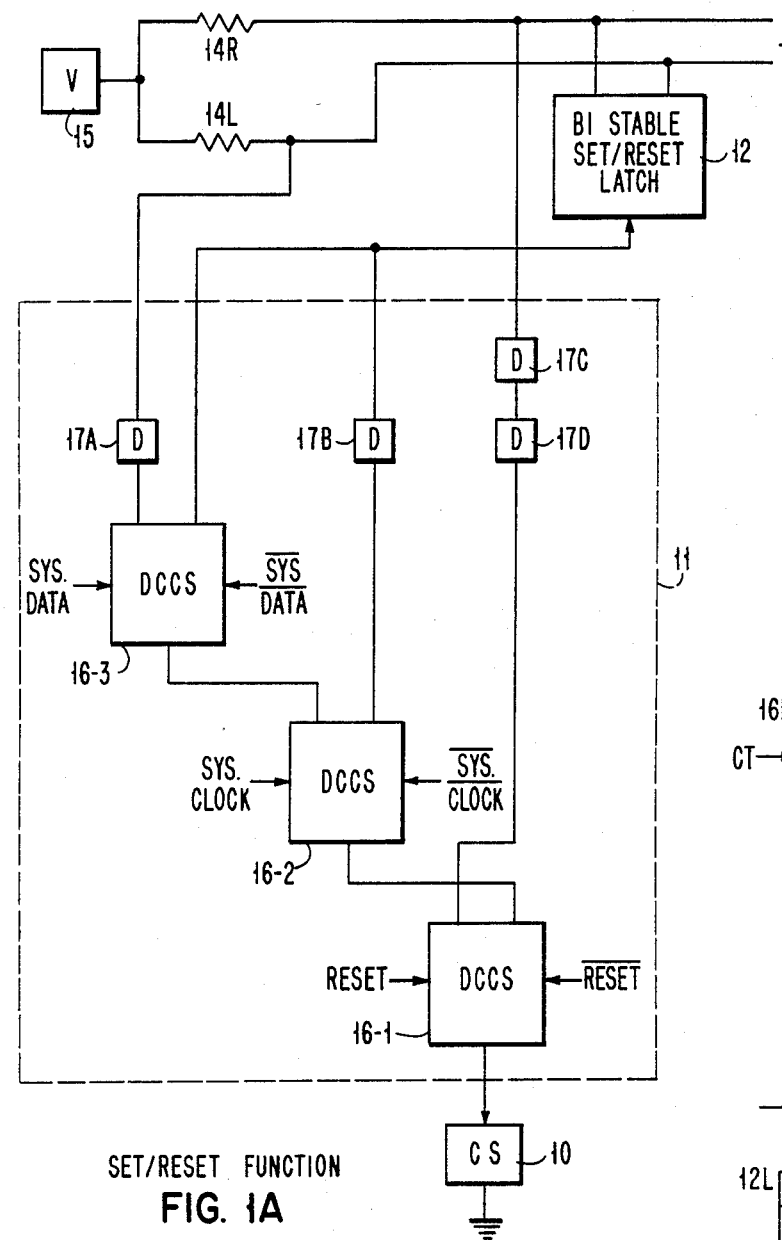
FIG. 1a is a schematic of a Differential Cascode Current Switch latch embodying the present invention.
Figure 1B:
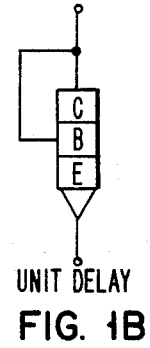
FIGS. 1b through 1d are schematic illustrations of the components shown functionally in FIG. 1.
Figure 1C:
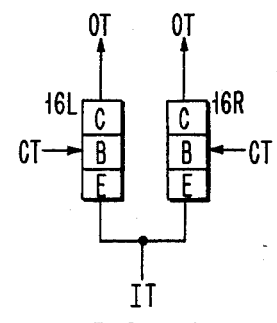
Figure 1D:
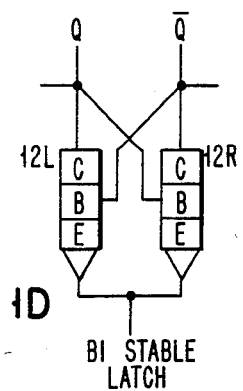

FIG. 1a illustrates a set/reset latch implemented in Differential Cascode Current Switch (DCCS) logic. The latch comprises a current source 10, a DCCS logic tree 11, a device 12 having a pair of cross-coupled transistors, a pair of load resistors 14L and 14R, and a voltage source 15. Logic tree 11 comprises a plurality of DCCS cells 16-1 through 16-3 and a plurality of delay elements 17A through 17D. A typical delay element is shown in FIG. 1b and comprises a bipolar transistor connected to function as a diode. A typical DCCS cell is shown in FIG. 1c and comprises a pair of bipolar transistors 16L and 16R which have their emitters interconnected to define an input terminal IT. The collector of each transistor serves as an output terminal OT, while the bases serve as control terminals CT for receiving differential control or logic signals "N" and "$\overline{N}$". Only one current path is allowed through the cell. FIG. 1d shows a typical bistable latch comprising a pair of cross-coupled transistors 12R and 12L which have their emitters interconnected and the collectors of one transistor connected to the base of the other transistor. The collectors are connected to load resistors 14R and 14L and provide the output terminal of the latch and the circuit. Current flows through only one transistor to maintain the latch condition. The device 12 is flipped when the current path is interrupted and a current path from the source 10 to the voltage source 15 is established through the other transistor.

A set/reset latch function is obtained by providing the differential reset signal to cell 16-1. Under normal conditions, the transistor 16R of cell 16-1 is conducting since the $\overline{\text{reset}}$ is high. The output of transistor 16R of cell 16-1 is connected to the input of cell 16-2 which is provided with the differential system clock signal. Output 16L of cell 16-1 is connected to one output of device 12. When the reset pulse is applied, transistor 16L of cell 16-1 conducts current causing current to flow through resistor 14R which lowers the voltage at terminal 12L of device 12 and shuts off transistor 12R. Assuming device 12 had been set with current flowing through resistor 12R, a toggle action results. If the device had been previously set to a "0" state, the reset pulse would not alter the state of the latch.

Device 12 stores system data in response to the system clock "sampling" the system data. The system clock is supplied differentially to cell 16-2 of tree 11, while system data is supplied differentially to cell 16-3. When the system clock is active, current from cell 16-2 is supplied to cell 16-3. When the system clock is low or inactive, a current path extends from the device 12 to the current source 10 through cells 16-2 and 16-1 to maintain the latched state.

When the system data signal applied to cell 16-3 is high, device 12 is set since a current path extends from voltage source 15 through resistor 14L which causes the transistor 12L of device 12 to be cut off. If, however, the system data is a "0", the application of the system clock to cell 16-2 merely sets up a current path in parallel with delay device 17B to the emitter of the transistors in device 12. The latch, therefore, remains in a "0" state. A reset signal applied from cell 16-1 to latch 12 when it is in a "0" state has no effect on the latch.

Tree 11 represents a three-level DCCS tree. Delay elements 17A through 17D function to equalize the delays in the different respective current paths which extend between current source 10 and device 12. The differential input signals to cells 16-3, 16-2 and 16-1 have different voltage levels which are determined by the voltage source 15 which, in practice, may be five volts with a separation of one volt between successive levels.

FIG. 2 illustrates a modification of the circuit shown in FIG. 1 to provide for an LSSD testing function.

As shown in FIG. 2, the modification involves the insertion into the DCCS tree of an LSSD three-input port 40, the details of which are shown in FIG. 2b, the addition of a DCCS cell 45 for receiving the scan data from the LSSD system, and the elimination of the DCCS cell 16-2 of FIG. 1 to which the differential system clock was supplied.

The LSSD port 40 comprises a set of three bipolar transistors A, B and C shown in FIG. 2b having their emitters interconnected to define an input terminal 41 which is connected to the $\overline{\text{reset}}$ output of cell 16-1. Port 40 has three output terminals 40A, 40B and 40C. Output terminal 40A is connected to the "scan data" cell 45, output terminal 40B is connected to the input of the "system data" cell 16-3, while output terminal 40C is connected to the emitters of transistors 16 of device 12 through delay 17E. Port 40 has three control input terminals connected respectively to the bases of transistors 40A, 40B and 40C. The control input terminals receive the LSSD clock, the system clock and a latch hold signal which have mutually exclusive ON states to insure that only one of the three transistors A, B and C is on at any one time. These signals are supplied from the port driver 50 which may be of the type shown in FIG. 5 and described later on in the specification. Alternately, other driving arrangements may be employed.

The operation of the circuit of FIG. 2 as a set/reset latch will now be described. The reset function is identical to that described in connection with FIG. 1 in that the reset signals of the two circuits are identical.

The set function of the FIG. 2 circuit operates functionally in the same manner as FIG. 1 in that system data is clocked into the latch in response to the system clock connecting the transistor 40B to the $\overline{\text{reset}}$ output of cell 16-1 and the input of cell 16-3 to which the system data is supplied. If the system data is a "1", device 12 is set in a manner identical to FIG. 1. If the system data is a "0", or inactive, the latch is not set, nor is it reset to "0" if it was a "1". A polarity hold latch function, on the other hand, would switch the latch from a "1" to a "0" state whenever the system data input was low.

Scan data is entered into the latch 12 by means of the LSSD cell 45 whose outputs are connected to differential outputs of the device 12. Scan data is clocked out of cell 45 in response to the LSSD clock being active which establishes a current path from source 10, the non-reset side of cell 16-1, transistor A of port 40 to cell 45. Depending on the state of the scan data, the current path through cell 45 will be through either the left or right transistor and the corresponding load resistor (not shown) of the latch. A value of "1" or "0" for the scan data may, therefore, be latched into device 12 through cell 45 providing a polarity hold function for the latch during LSSD testing.

The addition of the LSSD port, as shown in FIG. 2, does not affect the basic set/reset latch function described in connection with FIG. 1.

The latch hold input signal to the LSSD port functions to maintain the latched condition of device 12 when the clock signals are not active.

The latch circuit of FIG. 2 may be used as either the L1 or L2 latch of the LSSD Shift Register Latch pair.

The circuit shown in FIG. 3 is similar to the latch circuit shown in FIGS. 1 and 2 in that it involves a complex latch function implemented in Differential Cascode Current Switch logic and incorporates provision for LSSD testing.

As shown in FIG. 3, the latch circuit has a merged latch L1/L2 configuration similar to that disclosed in the cross-referenced application Ser. No. 06/445,601 referred to earlier. The L1 latch 60 is arranged with a mask function, while the L2 latch 65 is provided with a polarity hold function for scan data which is entered directly into the L2 latch.

The L1 and L2 latches are interconnected in accordance with the teaching of the cross-referenced application by employing a pair of DCCS cells 61 and 62 which have inputs connected to the outputs of the L1 latch through ballast resistors 63 and 64. The state of the L1 latch is transferred to the L2 latch in response to the "$\overline{\text{B}}$ clock" becoming active. Latch 65 is maintained in a latched state by a current path to L1 through one of the "B clock" transistors in cell 61 or 62. The term "merge" used in connection with the L1 and L2 latch implies that both latches are supplied from a common current source 72 through various DCCS cells.

In addition to transferring data from L1 to L2, scan data is also entered directly into L2 when both "B clock" and scan clock are active. When scan data is a "1", or active, current flows from terminal 66 of latch 65 causing the $\overline{\text{Q}}$ signal to be negative relative to terminal 67 and the output is in a "1" state with Q signal active. When "B clock" becomes inactive, latch 65 retains its current state independent of any subsequent changes in scan data or scan clock signals. Thus, "B clock" controls the condition of the L2 latch 65 independent of what is happening with the L1 latch 60.

Scan data is entered into the L1 latch when scan clock "A" becomes active. L1 latch 60 functions as a polarity hold latch relative to scan data since it will maintain its entered value when scan clock "A" becomes inactive. System data is entered into the L1 latch when the system clock becomes active provided that the mask input signal supplied differentially to cell 70 is active, thereby establishing a current path through the system data cell 71 from the current source 72. An active, or "1", mask signal provides a polarity hold function for the latch in that L1 will follow the system data when the mask signal is active. If the mask signal is "0" or inactive, then L1 latch 60 acts as a set/reset latch since, if it is in a set state, it will not be turned to the "0" state until the reset signal is supplied and, if it is in a "0" state, it will not be set to a "1" state.

The set/reset mask function for L1 is useful in priority interrupt systems where certain input signals are masked or enabled. If the interrupt request signals applied to the system data cells 71 are all clocked at the same time by the system clock, only the DCCS tree that is provided with an active mask input signal will have its latch 60 set. After the interrupt is serviced by the system, activating the reset line of the tree resets the L1 latch 10 to the "0" state. Port 74 is similar to port 40 of FIG. 2b. Port driver 75 is similar to FIG. 5.

Figure 4:
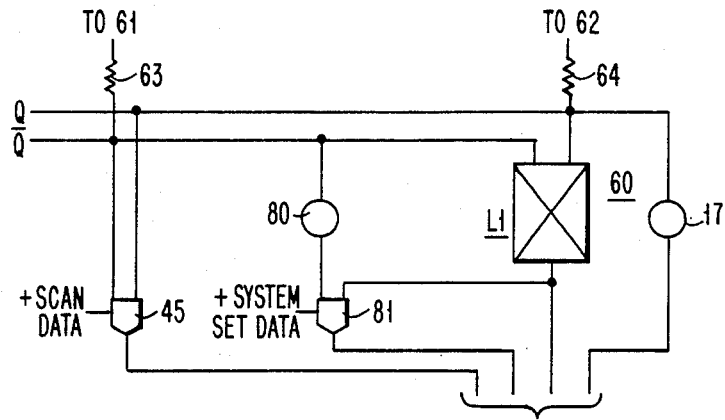
FIG. 4 is a LSSD latch similar to FIG. 3 in which the L1 and L2 latches are merged and the L2 latch acts as a polarity hold latch while the L1 latch acts as a set/reset latch.

FIG. 4 is similar to FIG. 3. FIG. 4 differs from FIG. 3 only in that the DCCS cell 71 in FIG. 3 and the DCCS cell 70 which receive the mask signal are replaced by a delay element 80 and a DCCS cell 81 which receives the system data. Stated differently, the difference may be viewed as replacing the cell 71 in FIG. 3 with the delay element 80 and supplying the system data signal to the DCCS cell 70 in place of the mask signal. The elements in FIG. 4 that are common with the elements in FIG. 3 have been provided with the same reference characters.

The latch L2 in FIG. 4 operates identical to the latch L2 in FIG. 3. Similarly, the L1 latch of FIG. 4 operates as the L1 latch of FIG. 3 when entering scan data. However, the L1 latch of FIG. 4 operates differently during the entry of system data. In FIG. 4, if the system data is active, i.e., a "1", when the system clock becomes active, then latch L1 will be set. If, however, the system data is inactive, i.e., a "0", when the system clock becomes active, then latch L1 is undisturbed. The set/reset function for system data is useful to log, for example, error conditions. The fact that an error occurred should be retained through subsequent clock cycles and only be erased by an error "reset" signal. By supplying the error signal as system data to cell 81 and the error reset as the reset signal to the LSSD port, the set/reset function may be obtained quite readily.

Figure 5:
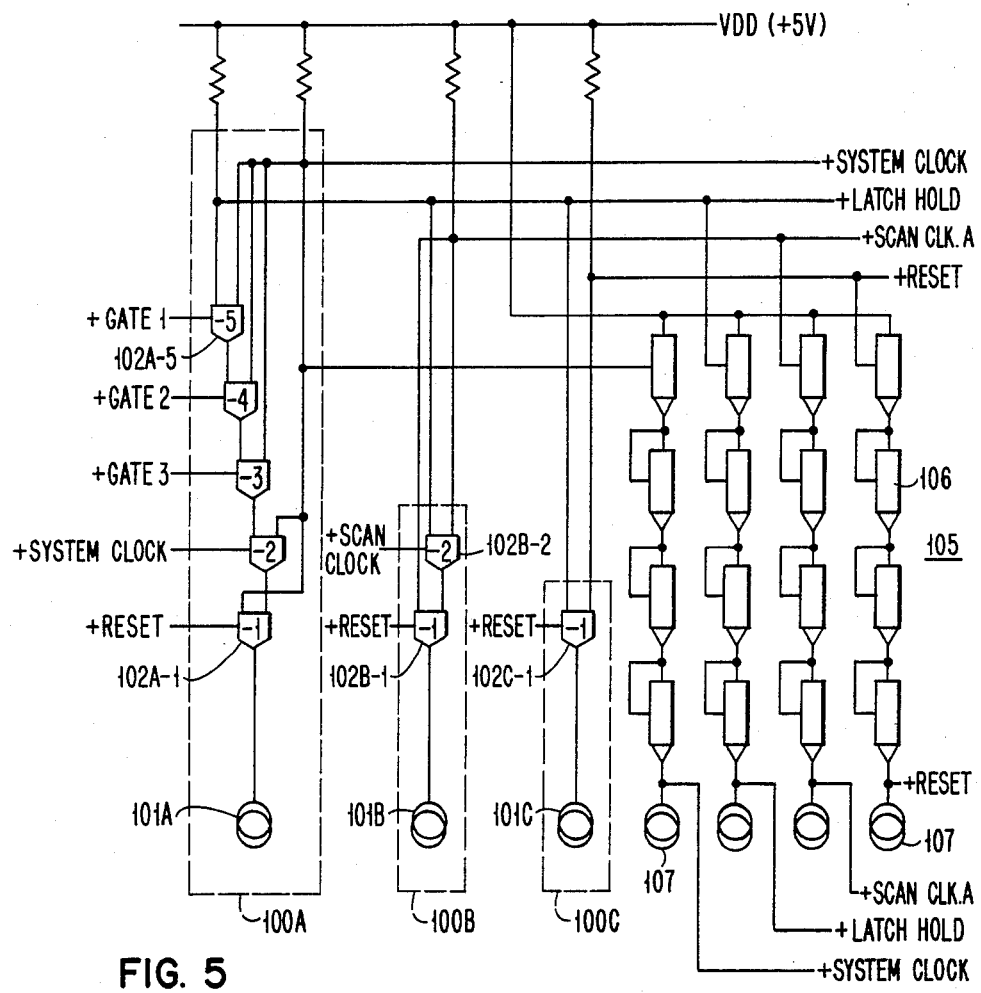
FIG. 5 is a schematic diagram of a port divider circuit for generating the input signals to the LSSD port of FIG. 4.

FIG. 5 illustrates the LSSD port driving system 75 for generating the signals applied, for example, to the LSSD port shown in FIGS. 2, 3, and 4. The system of FIG. 5 insures that only one output signal is active at any one time. As shown in FIG. 5, the LSSD port driving system comprises three separate DCCS tree units, 100A, 100B and 100C. Each tree unit comprises a current source 101 and one or more DCCS cells 102. DCCS tree unit 100A comprises five DCCS cells, 102A-1 through 102A-5 which are supplied respectively with the following five differential logic signals: Reset, System Clock, Gate 3, Gate 2, and Gate 1. DCCS tree unit 100B comprises two DCCS cells 102B-1 and 102B-2 which are supplied respectively with the reset and scan clock signals. DCCS tree unit 100C comprises one DCCS cell 102C-1 which is supplied with the reset signal. The scan clock and system clocks are mutually exclusive in the disclosed port driving system.

Each tree unit provides two output signals. Tree unit 1 provides system clock and a latch hold output signal; tree unit 2 provides the scan clock and latch hold output signal; tree unit 3 provides the reset and latch hold output signal.

The three latch hold output signals are dot ORed together and the voltage levels of all four output signals are translated back down to the "1" level before being supplied to the LSSD port. The level translator 105, as shown in FIG. 5, comprises four serially connected transistors 106 connected to a current source 107 associated with each output signal. The serially connected transistors are connected so that each transistor operates as one diode drop for each level. The output of the translator 105 is supplied to the LSSD port. The number of inputs to the LSSD port may be increased or decreased by adding or subtracting DCCS tree units in the port driver provided the additional tree unit is connected to insure that the basic condition of the driver is met, i.e., only one output being active at any one time.

While the invention has been particularly shown and described with reference to a preferred embodiment thereof, it will be understood by those skilled in the art that various other changes in the form and details may be made therein without departing from the spirit and scope of the invention.

Having thus described my invention, what I claim as new and desire to secure by Letters Patent is:

1. A set/reset latch circuit comprising in combination:
    (a) a cross-coupled pair of transistors arranged as a bistable device having first and second stable states and first and second output terminals;
    (b) a multi-level Differential Cascode Current Switch tree operable to develop set and reset control pulses for said circuit in response to logic input signals to switch said device respectively from said first state to said second state and vice versa;
    (c) a constant current source;
    (d) two load resistors, each of which is selectively connectable to said current source through said tree by said logic input signals;
    (e) means connecting said first and second output terminals to said load resistors; and
    (f) means for connecting said current source to said bistable device selectively through one of two different serial current paths of said tree to provide a current to one of said load resistors through one of said cross-coupled pair of transistors to hold said device in one of said stable states in the absence of said set and reset control pulses.

2. The latch circuit of claim 1 in which said logic input signals are differential signals and said tree includes at least one Differential Cascode Current Switch (DCCS) cell for each said differential signal.

3. The latch circuit of claim 2 in which said tree includes a predetermined number of different operable current paths between said current switch and said device.

4. The latch circuit of claim 3 in which some of said current paths include a delay component which has a signal delay corresponding to the signal delay of DCCS cell.

5. The latch circuit of claim 4 in which said DCCS cell at the first said level of said tree is adapted to receive a differential reset signal which, when active, functions to establish a reset current path to one said output terminals of said device to switch said device from said second stable state to said first stable state.

6. The latch circuit of claim 5 in which said reset current path includes two of said delay elements.

7. The latch circuit of claim 6 in which said tree further includes a second DCCS cell at a higher level adapted to receive a differential system data signal for establishing a set current path from the other of said load resistors through said second DCCS cell to said current source when said system data signal is a "1" and another path from from said device to said current source when said system data signal is a "0".

8. The latch circuit of claim 7 in which said set current path includes one said delay component.

9. The latch circuit of claim 7 in which said tree further includes a third DCCS cell at an intermediate said level which is adapted to receive a differential system clock signal that functions to connect said first cell to said third cell when said clock signal is active and said first cell to said device when said clock signal is inactive.

10. The latch circuit of claim 9 in which said system data signal supplied to said second cell switches said device to said second state when said clock signal is active, and said device remains in said second state until a reset signal is supplied to said device from said first cell regardless of subsequent active clock signals prior to said reset signal.

11. The latch circuit of claim 2 in which said tree further includes a Level Sensitive Scan Design input and means for entering scan in data selectively into said latch.

12. The latch circuit of claim 11 in which said tree further includes a scan in data DCCS cell for establishing selectively one of a pair of current paths from said current source through said LSSD port to said first and second output terminals in accordance with the value of said scan in data.

13. The latch circuit of claim 12 in which said input port includes a plurality of transistor switches each of which has an emitter coupled to said current source through the DCCS cell at the lowest level of said tree.

14. The latch circuit of claim 13 in which an LSSD clock signal is supplied to one of said transistor switches to connect said current source to said load resistors through said scan in data DCCS cell to switch said latch to one of said states corresponding to said scan in data.

15. The latch circuit of claim 14 in which a latch hold signal is supplied to another said transistor of said port to connect said current source to one of said load resistors through said device when said LSSD clock signal is inactive.

16. The latch circuit of claim 15 in which said LSSD port includes a third transistor for receiving a system clock signal for connecting said current source selectively to one of said output terminals through a DCCS cell adapted to receive system data to switch said device from the first state to the second state only when said system data and said system clock are active.

17. The latch circuit of claim 16 further including means connected to said LSSD input port to insure that one and only one of said plurality of transistors in said port is turned on at any one time.

18. The latch circuit of claim 1 further including a second latch circuit and means for connecting said first latch circuit to said second latch circuit to form a merged L1/L2 Shift Register Latch pair for LSSD testing, said connecting means including a DCCS cell for receiving a differential clock signal corresponding to the "B clock" of an LSSD testing system.

19. The latch circuit of claim 18 in which said tree includes a DCCS cell adapted to receive a differential mask signal and a four-input LSSD port including a plurality of switch transistors having their emitters coupled to said current source and means for supplying different signals to said switch transducers to operate said L2 latch as a polarity hold latch relative to said scan data and said L1 latch as a polarity hold latch relative to said scan in data and as a polarity hold latch relative to said system data when said differential mask signal is active and as a set/reset latch relative to said system data when said differential mask signal is inactive.

20. The combination recited in claim 18 in which said tree includes a four-input LSSD port including a plurality of switch transistors having their emitters coupled to said current source and means for supplying different signals to said switch transistor to operate said L2 latch as a polarity hold latch relative to scan in data and as a polarity hold latch relative to data transferred from said L1 latch, and said L1 latch as a polarity hold latch relative to scan in data and as a set/reset latch relative to system data.

21. The circuit recited in claim 20 in which said means for supplying different signals to said switch transistors comprises a plurality of DCCS tree units and a plurality of transistors serially connected together and associated with the output of each tree unit to translate the output of each said tree unit to a voltage level corresponding to level 1 of said LSSD port.

* * * * *